United States Patent
Belleau

(10) Patent No.: US 7,151,367 B2
(45) Date of Patent: Dec. 19, 2006

(54) METHOD OF MEASURING DUTY CYCLE

(75) Inventor: Raoul J. Belleau, Wimberley, TX (US)

(73) Assignee: Teradyne, Inc., Boston, MA (US)

(*) Notice: Subject to any disclaimer, the term of this patent is extended or adjusted under 35 U.S.C. 154(b) by 115 days.

(21) Appl. No.: 10/815,024

(22) Filed: Mar. 31, 2004

(65) Prior Publication Data

US 2005/0225314 A1  Oct. 13, 2005

(51) Int. Cl.
  *G01R 31/28* (2006.01)
  *G01R 31/08* (2006.01)
(52) U.S. Cl. .................... 324/158.1; 324/527
(58) Field of Classification Search .............. None
  See application file for complete search history.

(56) References Cited

U.S. PATENT DOCUMENTS

| | | | | |
|---|---|---|---|---|
| 4,792,932 A | * | 12/1988 | Bowhers et al. | 368/113 |
| 5,367,200 A | * | 11/1994 | Leonida | 327/33 |
| 6,441,600 B1 | * | 8/2002 | Atallah et al. | 324/76.11 |
| 6,687,844 B1 | * | 2/2004 | Zhang | 713/503 |

FOREIGN PATENT DOCUMENTS

| | | | |
|---|---|---|---|
| EP | 0957605 A2 | * | 10/1999 |
| JP | 2005292135 A | * | 10/2005 |

OTHER PUBLICATIONS

TERADYNE J973 Programming Guide, Chapter 12 Characterizing Devices. 560-923-37, Revision A, pp. 1-30, (Dec. 2001).

* cited by examiner

*Primary Examiner*—Jermele M. Hollington
(74) *Attorney, Agent, or Firm*—Wolf, Greenfield & Sacks, P.C.

(57) ABSTRACT

A method for measuring the duty cycle of a signal. The method is fast enough to allow duty cycle measurements of semi-conductor components during production. The method can also be performed inexpensively using automatic test equipment. A comparator in a digital channel is used to sense the state of an input signal at multiple points across the period of the signal. Fail processing circuitry within the tester is used to count the number of samples for which the input signal is in a logic HI state. This value is scaled by the total number of samples taken to produce a single number indicative of the duty cycle of the signal.

24 Claims, 3 Drawing Sheets

METHOD OF MEASURING DUTY CYCLE

BACKGROUND OF INVENTION

1. Field of Invention

This application relates generally to automatic test equipment and more specifically to measuring duty cycle with automatic test equipment.

2. Discussion of Related Art

In the manufacture of electronic components, such as semiconductor chips, there is often a need for measuring parameters of electrical signals. By comparing the measured parameters to expected values, components operating incorrectly can be detected. While a component is being designed, detecting incorrect operation can provide information to allow the design to be improved.

During manufacture, every component made is often tested at least once. Sometimes, semiconductor components are tested while still part of a wafer or at some intermediate stage of the manufacturing process. Components operating incorrectly at this intermediate stage might simply be discarded to save the cost of further processing. Other times, the results of testing are used to alter the manufacturing operation to reduce the number of defective components. For example, yield management software aggregates failures found in many components to identify manufacturing equipment that is out of calibration or other problems in the fabrication of the components. By altering the manufacturing process to remove these problems, the process yields a higher percentage of fully functioning components.

Results of testing can also be used to alter the manufacturing operation in other ways. For example, components operating incorrectly might be altered to operate satisfactorily, such as with laser trimming or built in calibration circuitry. Alternatively, testing might be used for "binning" the components. Components that do not perform as expected under certain test conditions might perform adequately under other, less stringent, conditions. For example, components that operate incorrectly at a temperature of 125° C. might perform adequately at 105° C. These components might be marked and packaged for sale at a lower temperature range. Likewise, components that do not operate correctly at high clock rates might meet all operational requirements at a lower clock rate. These components might be sold for operation at the lower clock rate. Assigning components maximum operating rates as the result of testing is sometimes called "speed binning."

Automatic test equipment, sometimes called a tester, is designed to rapidly test semiconductor components. To economically test every component being manufactured, automatic test equipment must run a complete set of tests on a component in a short period of time, such as a few seconds. Automatic test equipment often includes a plurality of digital channels that each can either generate or measure a digital signal for one test point.

The tester runs "patterns." A pattern is a program that causes the tester to perform a test or tests. The pattern contains a sequence of vectors. Each vector specifies the operation of all the digital channels during one cycle of the tester's operation. The tester executes the vectors in rapid succession to create the desired sequence of stimulus signals and measurements. The timing of the vectors can be controlled to set the speed at which a component under test operates during the test.

Each vector specifies for each channel whether, during a particular cycle, that channel is to generate a signal or measure a signal. Where the channel is to generate a signal, the vector specifies whether the signal should have a logical value of HI or LO. Conversely, when the channel is to measure a signal, the vector specifies the expected value of the signal. The channel outputs a fail signal if the measured signal does not have the expected value when measured.

A tester may also be programmed to control other operating parameters. For example, the voltage levels corresponding to a logical HI or a logical LO signal can usually be programmed. Further, the timing at which events occur within a cycle can be programmed. The time at which the channel should apply an output value can be programmed relative to the start of the cycle. Likewise, the time at which the channel should sample the signal to measure its value can also be programmed relative to the start of the cycle. The time at which a sample should be made is sometimes called the "strobe" time.

The tester includes failure processing circuitry that captures the fail signals generated by the channels. This information about failures is used to identify defective components or as an aid in diagnosing problems with the design of the component or the manufacturing operation used to make the component. One simple function that the failure processing circuitry can perform is to count the number of failures in each channel during a pattern.

The digital channels are designed for generating and measuring digital values. Traditionally, testing using digital channels indicates whether the device is outputting a logic HI or logic LO at a time when an output is expected. Testers often include "instruments" for generating or measuring analog signals. For example, an arbitrary waveform instrument generates an analog signal that has a waveform that can be programmed with almost any shape. Other instruments might rapidly sample an analog signal and perform advanced signal processing functions on the captured samples, such as to find a power spectral density or other characteristics of an analog signal. Yet other instruments might measure jitter in a signal.

One parameter of a signal that might be desirable to measure is the duty cycle of a clock signal. Traditionally, the duty cycle has been measured using bench-top instruments, such as oscilloscopes. Such measurements are not suitable for use in a manufacturing process where components must be quickly tested. Heretofore, the duty cycles of components have generally been "guaranteed by design," meaning that the component was designed to produce a signal with a certain duty cycle, but each component manufactured was not tested to verify that it complied with the design.

We have recognized that this approach is likely to be less suitable for purchasers of semiconductor components as semiconductor components operate at higher speeds. Generally, the range of expected duty cycle for a properly functioning component is specified as a percentage of the clock period. As clock frequencies increase, the periods get smaller and the acceptable deviation in the duty cycle is smaller. With a smaller acceptable deviation, testing is more likely to be required to ensure all components manufactured meet the specification. Trimming, calibration or speed binning are more likely to be needed to provide components meeting the required specification. We have recognized that it would be desirable to provide a simple and fast way to measure duty cycles of components during their manufacture without requiring a special instrument.

Heretofore, some analog parameters have been measured without special instruments. The digital channels of the tester are sometimes programmed to make analog type measurements. One example is an "edge find" routine, sometimes called a "timing search." "Edge find" identifies the time at which a signal transitions through a predefined voltage (i.e. an edge), such as a digital signal transitioning from one state to another.

To perform an edge find, the signal is applied to a channel in the tester. The applied signal must contain periodic copies of the edge. Periodic copies of the edge are inherently contained in a periodic signal, such as a clock. Where the signal is not inherently periodic, a periodic signal can be generated by repetitively generating the portion of the signal containing the edge. Where the edge find routine is performed by a tester, a component under test can be controlled to repetitively generate a portion of a signal by repetitively executing an entire test pattern or alternatively by looping through a subset of the test pattern.

As an example of an edge find measurement on one test vector, the digital channel receiving the signal is programmed to measure the value of the signal and to expect the value to be a logical LO. The channel is programmed to recognize as a LO signal any signal with a value below a threshold voltage. The threshold is set to be near the mid-range of the edge. When the value of the signal is above this threshold, the channel indicates the measurement "failed." Conversely, the channel indicates a pass when the voltage of the signal is below the threshold.

This measurement provides information about the value of the signal at one strobe time. In an edge find routine, measurements are repeated for many strobe times. The strobe time is incremented for successive measurements, in a search for two strobe points with a specific time difference that report different results (e.g. one reports pass, and the other reports fail). The time difference between these strobe points is often described as the measurement resolution, because the signal transition is known to occur somewhere between these two points. Multiple search algorithms have been applied with a goal to find the transition point at a desired resolution with a minimum number of strobe points.

While such a technique is useful, there still exists a need for a way to quickly and at low cost measure the duty cycle of a signal.

SUMMARY OF INVENTION

The invention relates to an improved method of measuring duty cycle of a signal.

In one aspect, the invention a method of measuring duty cycle of an interval of a signal that includes providing as an input signal repetitions of the interval of the signal and making a plurality of comparisons of the value of the input signal to a threshold at controlled times relative to the start of a repetition of the interval. As part of making the plurality of comparisons, the controlled time is varied. The duty cycle is computed based on the number of comparisons having a value a predetermined range relative to the threshold.

In another aspect, the invention relates to a method of measuring the duty cycle of a signal using automatic test equipment that can be programmed to run test patterns. The method is useful in connection with automatic test equipment that has: i) a timing generator that generates strobe signals at programmable times; ii) a comparator that may be programmed to make a comparison of the value at its input to an expected value at times controlled by strobe signals from the timing generator; and iii) failure processing circuitry coupled to the output of the comparator that may be controlled to count the number of comparisons indicating that the value at the input of the comparator deviates from the expected value during a pattern. The method includes providing the signal as an input to the comparator; running a pattern with the timing generator programmed to produce strobe signals with a first time relationship to the signal, the pattern programming the expect value of the comparator to be a value indicating that the signal is in a first logical state; at the end of the pattern, recording the count of comparisons made by the failure processing circuitry indicating that the value at the input of the comparator deviates from the expected value; and iteratively altering the programming of the timing generator to produce strobe signals with a different time relationship to the signal, re-running the pattern and recording the count of comparisons indicating that the value at the input of the comparator deviates from the expected value made by the failure processing circuitry. The duty cycle is computed from the total number of comparisons indicating that the value at the input of the comparator deviates from the expected value made by the failure processing circuitry.

In yet a further aspect, the invention relates to automatic test equipment programmed to measure the duty cycle of an input signal. Such test equipment includes a timing generator that generates strobe signals at programmable times; a comparator having an signal input coupled to the input signal, a strobe input coupled to the timing generator, a threshold input and an digital output having a state dependent on the relative level at the signal input and the threshold input at a time dictated by the strobe input; and failure processing circuitry coupled to the output of the comparator that may be controlled to count the number of digital outputs of the comparator indicating that the value at the input of the comparator deviates from a programmable expected value. A software program controls the automatic test system to perform a method that includes: running a pattern with the timing generator programmed to produce strobe signals with a first time relationship to the signal, the pattern programming the expect value of the comparator to be a value indicating that the signal is in a first logical state; iteratively altering the programming of the timing generator to produce strobe signals with a different time relationship to the input signal and re-running the pattern. The duty cycle is computed from one or more values counted by the failure processing circuitry indicating the total number of comparisons during all iterations of the pattern indicating that the value at the input of the comparator deviates from the programmed expected value.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
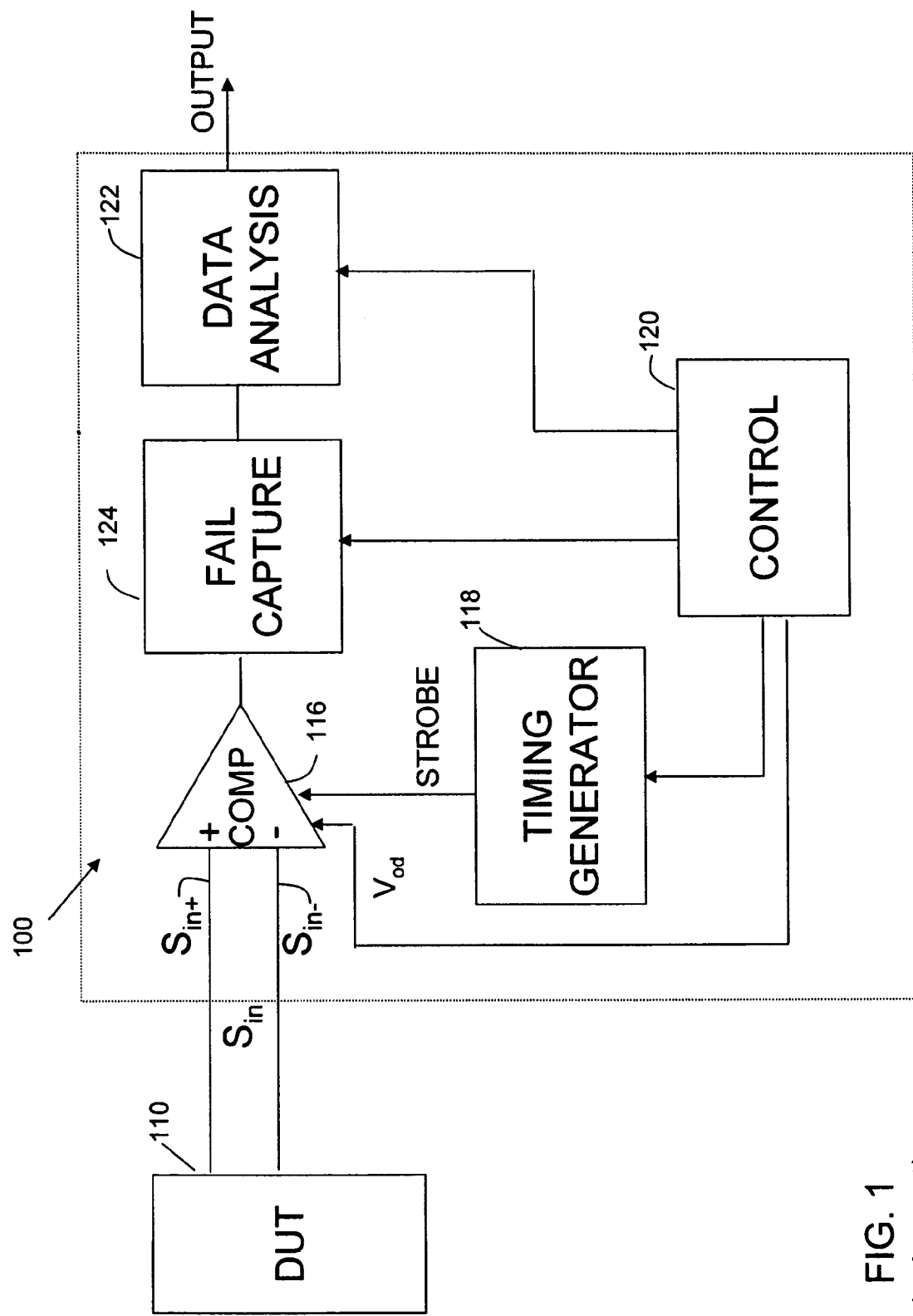
FIG. 1 is sketch illustrating a portion of an automatic test system useful in measuring duty cycle.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 shows in greatly simplified form, tester 100. Tester 100 may be a commercially available tester for example, the Tiger™ test system available from Teradyne, Inc. of Boston, Mass.

Tester 100 includes a differential comparator 116. Differential comparator 116 can be a portion of the circuitry in a digital channel of tester 100. For simplicity, other circuitry within the channel is not shown. Likewise, other channels within the tester are not shown, but a commercially available tester might have hundreds or over a thousand such channels. All channels of the tester need not include differential comparators as shown in FIG. 1. However, the techniques described herein are most useful in connection with very fast signals. Such signals tend to be represented as differential signals. If the input signal to be measured is differential, it is desirable that the tester resource connected to this pair of pins includes a differential comparator 116 as illustrated. Conversely, if the input signal to be measured is single-ended, it is desirable that the tester resource connected to this pin includes a single-ended comparator.

Differential comparator 116 produces an output signal indicating the relative levels of the signals at its positive and negative inputs. In the configuration shown in FIG. 1 the positive input of comparator 116 is connected to the positive leg $S_{in+}$ of an input signal $S_{in}$. The negative input of comparator 116 is connected to the leg $S_{in-}$ of differential signal $S_{in}$.

Differential comparator 116 has an input that specifies a threshold, $V_{od}$. When the value at the positive input of comparator 116 exceeds the value at the negative input by an amount equal or greater than $V_{od}$, the output of comparator 116 indicates a logical HI. When the difference between $S_{in-}$ and $S_{in+}$ is below the threshold $V_{od}$, the output of comparator 116 indicates a logical LO.

The time at which comparator 116 makes a comparison is determined by the strobe signal generated by timing generator 118. Preferably, timing generator 118 is a programmable timing generator such that the times at which the strobe signal is asserted can be programmed.

Timing generator 118 is in turn controlled by control logic 120. Control logic 120 may be a combination of special purpose hardware and a general purpose computer that can be programmed to perform test functions. Control logic 120 also supplies the signals that set the threshold, $V_{od}$ of comparator 116.

The output of differential comparator 116 is provided to failure processing circuitry 124. Traditionally, failure processing circuitry 124 includes a high speed memory that stores the results of comparison made by differential comparator 116. Preferably, failure processing circuit captures the output of differential comparator 116 at the same rate at which a test pattern is being run by tester 100. To achieve very fast operation, failure processing circuitry might compress the data representing a stream of outputs from comparator 116 for storing it in memory. For example, failure processing circuitry 124 might store only those outputs of comparator 116 that indicate the measured signal did not have the expected value. However, any convenient means of storing data in failure processing circuitry 124 can be used.

Tester 100 also includes data analysis circuitry 122. Data analysis circuitry 122 can be a combination of special purpose hardware and general purpose computers programmed to perform data analysis functions. Data analysis could be performed on the same general purpose computer that is used to implement control logic 120. Among the other functions of data analysis circuitry 122, it is in the preferred embodiment programmed to analyze the data in fail processing circuitry 124 to compute the duty cycle of the signal $S_{in}$.

In FIG. 1 the signal $S_{in}$ is shown being generated by a device under test 110. In a preferred embodiment, device under test 110 is a semiconductor component being tested during its manufacture.

Figure 2:
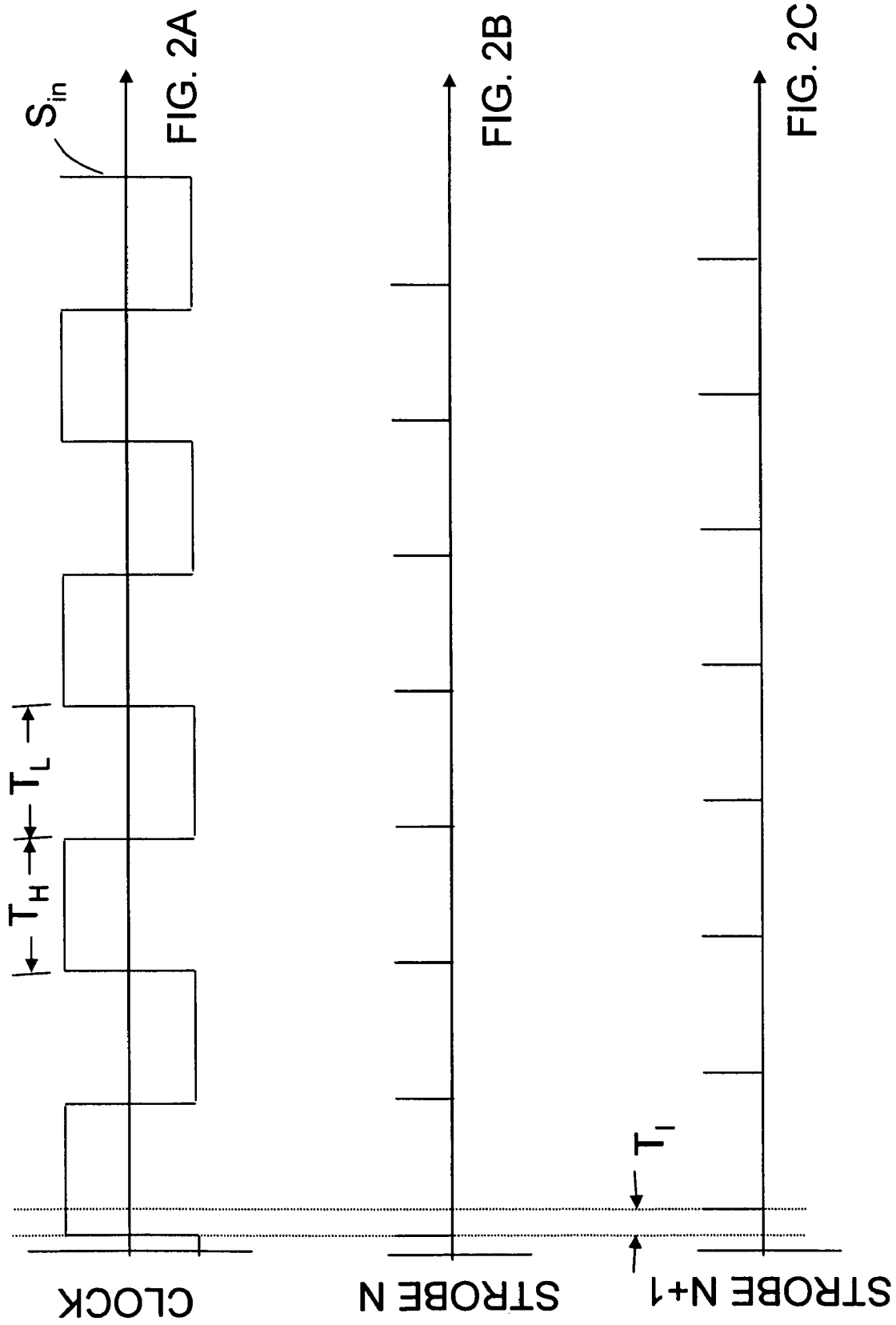
FIGS. 2A, 2B and 2C are sketches useful in understanding a method of measuring duty cycle.

FIG. 2A illustrates a periodic signal on which a duty cycle measurement might be performed. Such a signal might be provided as the signal $S_{in}$ to tester 100. A periodic signal such as is represented in FIG. 2A might serve as a clock for a digital logic system.

FIG. 2A shows that the signal $S_{in}$ has multiple periods during which the signal alternatively takes on a HI value and a LO value. Within each period, the signal has a HI value for an amount of time designated $T_H$. The signal has, within that same period, a LO value for a period of time $T_L$. There are multiple ways in which the duty cycle of the signal $S_{in}$ might be defined. In the examples used herein, the duty cycle is defined by the equation $$\text{DUTY CYCLE} = \frac{T_H}{(T_H + T_L)}.$$

The values of $T_H$ and $T_L$ are labeled in FIG. 2A for only one period of the signal $S_{in}$, for clarity. Each period of the signal has its own value of $T_H$ and $T_L$. Duty cycle is typically specified based on the average values of $T_H$ and $T_L$ for all periods in the signal measurement window. In this way, the specification for duty cycle is separated from specifications of timing jitter.

Figure 3:
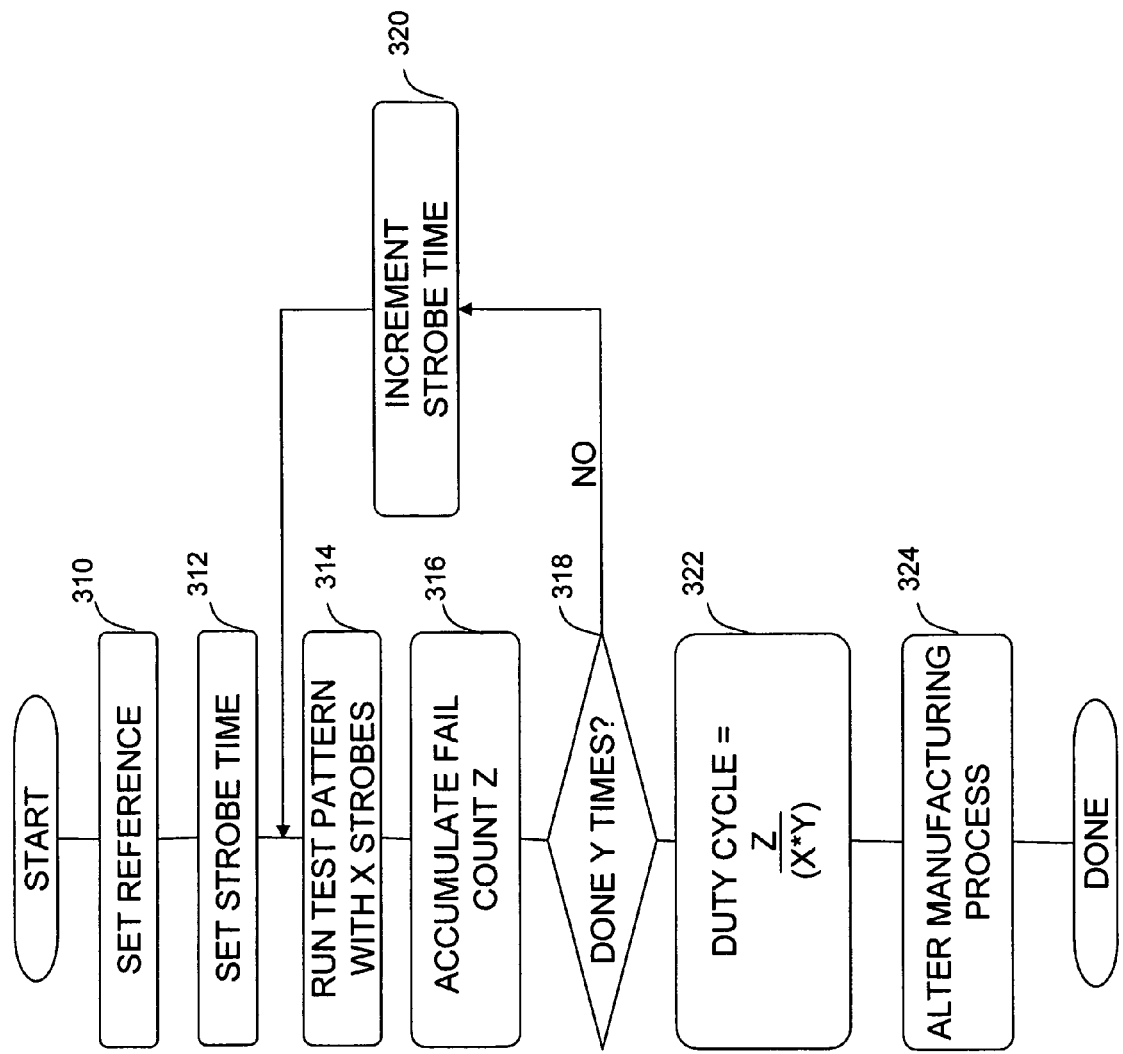
FIG. 3 is a flow chart useful in understanding a method of measuring duty cycle.

FIG. 3 shows a process by which the circuitry of FIG. 1 can be used to measure the duty cycle of the signal $S_{in}$ shown in FIG. 2A. The process begins at step 310. At step 310 the reference level $V_{od}$ is set. The reference value is typically set at the expected midpoint level between the level of signal $S_{in}$ while it is in a HI state and a level when it is at a LO state. In the example illustrated in FIG. 2A, signal $S_{in}$ oscillates symmetrically between positive and negative values. Therefore, setting the reference level to zero volts is a suitable value in this example. With this setting, comparator 116 (FIG. 1) will produce outputs of different logical levels for different states of the signal $S_{in}$.

The process proceeds to step 312 where the strobe time is set. Preferably, the strobe time is set to initially be coincident with the start of each period of the input signal $S_{in}$. This condition is illustrated in FIG. 2B. FIG. 2B illustrates that strobe signals occur at regular, evenly spaced intervals, with a time interval between strobes designated as $T_2$. Preferably, as illustrated in FIG. 2B, an integer number of strobes are placed at regular intervals within each period of input signal $S_{in}$.

Returning to FIG. 3, the process proceeds to step 314. At step 314 tester 100 runs a test pattern using the reference level and strobe time set at steps 310 and 312. In this test pattern, fail processing circuitry 124 is programmed to expect a low output of comparator 116 for every measurement by comparator 116. With this programming, fail processing circuitry 124 will count a failure for each assertion of the strobe signal at which signal $S_{in}$ is in a high state.

The test pattern initiated at step 314 performs the comparison operation on the input signal $S_{in}$ multiple times. The number of measurements made in one run of the test pattern is here denoted X. Preferably, comparison operations are performed across multiple signal input periods to average out the effects of noise-induced jitter in the signal $S_{in}$ or in the measurement process, in keeping with most duty cycle specifications. In one example, the value of X is approximately ten thousand. However, a greater or lesser number of samples might be taken, depending on the amount of noise in the signal or the amount of time available to perform the test.

At the end of the pattern, the processing proceeds to step 316. At the end of a test pattern, the number of strobes for which the signal Sin had a HI value is equal to the number of strobes for which the actual measurement did not match the programmed expected value. This value is stored as a fail count within failure processing circuitry 124.

For a measurement of duty cycle, the pattern run at step 314 will be repeated multiple times, here denoted Y. The total number of fails recorded in all repetitions of the pattern is denoted as Z. If the fail count kept by failure processing circuitry 124 is reset after each pattern, data analysis circuitry 122 accumulates the number of fails in all of the patterns used in the process shown in FIG. 3. Data analysis circuitry 122 can read the failure count at the end of each pattern from failure processing circuitry 124 and add that value to an accumulated failure count that is reset at the beginning of the process shown if FIG. 3.

At step 318, a check is made as to whether the test pattern described at step 314 has been repeated the required number of times. If not, processing proceeds to step 320. At step 320, the strobe time set at step 312 is incremented. In FIG. 2C, the increment in this strobe time is indicated as $T_1$. Preferably, each of the strobe times illustrated in FIG. 2C occurs at a time correlated with the period of the signal $S_{in}$ shown in FIG. 2A. However, each strobe time depicted in FIG. 2C occurs an amount of time $T_1$ later than the corresponding strobe signal in FIG. 2B. Incrementing the strobe time has the effect of measuring the value of the signal $S_{in}$ at a slightly later point in the period than was measured with the strobe timing illustrated in FIG. 2B. Preferably, the resolution of the interval $T_1$ is set to a value that is suited to determine compliance of a signal with its specifications. For example, if the duty cycle specification calls for a signal to have a duty cycle of 50% plus or minus 0.5%, it would be desirable to set a $T_1$ equal to 0.05% of the signal period. For example, $T_1$ might equal 1/200 of the period of signal $S_{in}$. With this setting, the value of Y—representing the number of times the pattern is run—could be 200.

Regardless of the specific values chosen, the loop containing steps 314, 316, 318, and 320 will be repeated until data has been collected for a sufficient number of strobe times. Preferably, the number of strobe times will be sufficient that samples have been taken at a numerous times relative to the start of the period of the input signal and that the samples will be evenly distributed across that period.

When sufficient data is collected, processing proceeds to step 322. At step 322, data analysis circuitry 122 may compute the duty cycle. For the formula given for the duty cycle above, a value for the duty cycle can be determined by dividing the value of Z by the product of X and Y. Preferably, two restrictions be placed upon the values chosen for $T_1$, $T_2$, X and Y when this formula is used. The first restriction ensures that strobes are evenly spaced throughout the measurement range, and is stated as follows: The value Y must be a positive integer multiple of the quotient $T_2$ divided by $T_1$. The second restriction ensures that the an integer multiple of signal periods will be measured, and is stated as follows. The product of X and $T_2$ must be a positive integer multiple of the period of signal $S_{in}$.

At step 324, the computed duty cycle can be used to alter the manufacturing process of the semiconductor components. Various responses to a measured duty cycle are possible. For example, the duty cycle measured for device under test 110 might be compared to a specification for devices of that type. If the duty cycle falls within the specification, the device might be packaged and sold as a working device. Alternatively, if the device under test does not exhibit a duty cycle within the specification, the device might be discarded. Alternatively, the device might be assigned to a speed bin for lower speed parts. The device might then be packaged and marked accordingly.

Alternatively, the results of duty cycle measurements might be used to alter the fabrication portion of the manufacturing process. As a further alternative the results of the duty cycle measurement might be used for calibration or some other process by which the duty cycle of the specific device under test is altered.

The method described above has the advantage of allowing a direct duty cycle measurement without the need for special purpose analog instruments. Further, it takes advantage of electronic circuitries within the digital channels of the tester 100 that inherently are capable of operating with high speed signals. Therefore, this technique is suitable for measuring high speed signals having data rates of 1 Gb/s or higher.

The technique also has the advantage of being relatively fast. The speed at which this test method can be performed allows it to be performed on every part being manufactured without unduly slowing the manufacturing process. Advantageously, the duty cycle measurement described above can be performed by automatic test equipment traditionally used in the manufacture of semiconductor devices. Comparators and failure processing circuitry used for traditional high speed digital testing can be employed to make duty cycle measurements.

Having thus described several aspects of at least one embodiment of this invention, it is to be appreciated various alterations, modifications, and improvements will readily occur to those skilled in the art.

For example, FIG. 2B shows that the strobe time is set to have two samples per period of the signal $S_{in}$. Fewer samples might be taken per period. However, to achieve the same results, the value of Y—representing the number of increments in strobe time—would have to be doubled. Alternatively, the number of strobe times per period of the signal $S_{in}$ could be greater than 2. Preferably, the number of strobe times per period will be an even number. Regardless, increasing the number of strobe times per period would allow the value of Y to be proportionately decreased.

Further, it was described above that the strobe time was set to take two samples per period of the input signal $S_{in}$. In conjunction with this setting, the strobe increment was described to be a fraction of the period of the signal $S_{in}$ equal to the inverse of the value Y. With two samples per period, this combination of values creates a situation in which the value Y is an integer multiple of 2 times the quotient of $T_2$ divided by $T_1$. Using a value of Y that is an integer multiple of 2 or more times the quotient of $T_2$ divided by $T_1$ has an additional averaging effect that should further reduce the susceptibility of the test method to noise. However, it is not required for proper performance of the technique.

Further, it was described that tester 100 includes a differential comparator 116 which has a programmable offset value $V_{od}$. Other circuit elements might be used instead. For example, the invention is illustrated by a system measuring the duty cycle of a differential signal. While duty cycle measurement is particularly valuable in connection with high speed signals, which tend to be differential signals, application of the invention is not so limited and might be employed to measure the duty cycle of single ended or other types of signals. For measurements on single ended signals, comparator 116 would be a single-end comparator, rather than the differential comparator illustrated in FIG. 1, and the chosen reference voltage would usually be the midpoint of the expected signal swing.

Also, the comparator is described as producing a logical signal indicating whether the input is above or below a threshold. It is described above that the comparator has an output signal with only two possible states. However, some comparators output separate signals to indicate separate states. One signal might be used to indicate the input is above a threshold that indicates a valid HI state and a separate signal that indicates the input is below a threshold that indicates a valid LO state. Such a comparator indicates more than two states of the signal. It can indicate that the signal is HI or LO. It can also indicate that the signal has an intermediate state or undefined state. Such a comparator might be used in the process described above by setting the LO threshold to the desired reference value and the HI threshold to any other complementary value. The LO threshold is important because the technique describes a pattern that is programmed to expect a logical LO output from comparator 116 for every measurement by comparator 116. The inverse approach of using the HI threshold and programming a pattern to expect a logical HI for every measurement by comparator 116 is also valid, but the equation to calculate duty cycle would need to be amended slightly in accordance with this approach.

Further, samples are described as being collected over a range of strobe times by incrementing the strobe time between patterns. The order in which the samples are collected is not significant. Any order of collecting samples that results in the same distribution of samples over the interval of the signal of interest should produce acceptable results. Preferably, the distribution of samples should be uniform over the interval of interest.

The principles of this technique may also be combined with the use of timing edge searches to optimize test time by reducing the required iterations of the pattern described by the value Y. In this approach, the spacing between strobes designated by the value $T_2$ must be synchronous with the period of the input signal $S_{in}$. This is the case if there is consistently a positive integer multiple of strobes per period of the signal $S_{in}$ or vice versa. In this test time optimization, timing edge search techniques would be used to quickly determine a coarse timing range within the period of the signal $S_{in}$ that contains voltage transitions. The data collection process represented by the loop in steps 314, 316, 318 and 320 from FIG. 3 would then only be required within this narrower range in which signal edges are known to occur. Everything outside of this range can reliably be predicted to have a fail count Z equal to half of the total number of strobes X. As an example, if it is found that voltage transitions occur only at a strobe position N plus or minus 5% of the signal period, the product of T1 and Y can be reduced to cover only this 10% portion of the signal period, resulting in an order of magnitude decrease in the required number of process iterations.

Such alterations, modifications, and improvements are intended to be part of this disclosure, and are intended to be within the spirit and scope of the invention. Accordingly, the foregoing description and drawings are by way of example only.

What is claimed is:

1. A method of measuring duty cycle of an interval of a signal, comprising the acts:
   a) providing as an input signal repetitions of the interval of the signal;
   b) making a plurality of comparisons of the value of the input signal to a threshold, each comparison being made at a controlled time relative to the start of a repetition of the interval, wherein making the plurality of comparisons includes varying the controlled time, thereby making a plurality of comparisons at times that are coherent with the repetitions of the interval; and
   c) computing a duty cycle, based on the number of comparisons having a value in a predetermined range relative to the threshold.

2. The method of claim 1 wherein the signal is a digital clock and the interval is a positive integer multiple of the period of the clock.

3. The method of claim 1 wherein the signal is a differential signal.

4. The method of claim 3 wherein the input signal is a differential signal with two legs and comparing the value of the input signal to a threshold comprises comparing the voltage difference between the legs to the threshold.

5. The method of claim 4 wherein the threshold represents the value at which the two legs have equal voltages.

6. The method of claim 1 wherein the method is performed using automatic test equipment to make the plurality of comparisons and vary the controlled time.

7. The method of claim 6 wherein making a plurality of comparisons also includes counting the number of comparisons having a value in the predetermined range relative to the threshold.

8. The method of claim 6 wherein the signal is generated by a semiconductor device under test connected to the automatic test equipment.

9. The method of claim 7 wherein making a plurality of comparisons comprises using a comparator having a strobe input.

10. The method of claim 9 wherein the automatic test equipment comprises a programmable timing generator providing a timing signal coupled to the strobe input of the comparator and varying the controlled time comprises changing the programming of the timing generator to change the time of the timing signal at the strobe input to the comparator.

11. A method of measuring duty cycle of an interval of a signal, comprising the acts:
   a) providing as an input signal repetitions of the interval of the signal;
   b) making a plurality of comparisons of the value of the input signal to a threshold, each comparison being made at a controlled time relative to the start of a repetition of the interval, wherein making the plurality of comparisons includes varying the controlled time;
   c) computing a duty cycle based on the number of comparisons having a value in a predetermined range relative to the threshold; and
wherein making a plurality of comparisons comprises running a test pattern a plurality of times, and varying the controlled time comprises varying the controlled time between runs of the test pattern.

12. The method of claim 11 wherein the test pattern controls automatic test equipment to make X samples and the pattern is repeated Y times.

13. The method of claim 12 wherein the automatic test equipment makes a number of comparisons and the duty cycle is computed by dividing the number of comparisons counted by the product of X and Y.

14. A process of manufacturing semiconductor devices wherein the method of measuring duty cycle of claim 11 is used to measure the duty cycles of signals produced by semiconductor devices being manufactured and the method further comprises altering the process of manufacturing semiconductor devices based on the duty cycles.

15. The method of claim 14 wherein altering the process of manufacturing semiconductor devices comprises selecting semiconductor devices having a duty cycle within a predetermined range for further processing.

16. The method of claim 14 wherein altering the process of manufacturing semiconductor devices comprises speed binning semiconductor devices based on the duty cycle of the device.

17. The method of claim 14 wherein altering the process of manufacturing semiconductor devices comprises adjusting parameters of fabrication equipment based on statistical properties of the measured duty cycles of the signals produced by a plurality of the semiconductor devices being manufactured.

18. The method of claim 1 wherein the controlled times are controlled so that the plurality of comparisons are made at times relative to the start of a repetition of the interval that are uniformly distributed over the duration of the interval.

19. A method of measuring duty cycle of an interval of a signal, comprising the acts:
   a) providing as an input signal repetitions of the interval of the signal;
   b) making a plurality of comparisons of the value of the input signal to a threshold, each comparison being made at a controlled time relative to the start of a repetition of the interval, wherein making the plurality of comparisons includes varying the controlled time;
   c) computing a duty cycle based on the number of comparisons having a value in a predetermined range relative to the threshold; and
   wherein the method is performed using automatic test equipment that can be programmed to run test patterns, the automatic test equipment having: i) a timing generator that generates strobe signals at programmable times; ii) a comparator that may be programmed to make a comparison of the value at its input to an expected value at times controlled by strobe signals from the timing generator; and iii) failure processing circuitry coupled to the output of the comparator that may be controlled to count the number of comparisons indicating that the value at the input of the comparator deviates from the expected value during a pattern;
   e) wherein:
      i) the act (a) comprises providing the input signal to the comparator;
      ii) the act (b) comprises:
         A) running a pattern with the timing generator programmed to produce strobe signals with a first time relationship to the input signal, the pattern programming the expect value of the comparator to be a value indicating that the input signal is in a first logical state;
         B) at the end of the pattern, recording the count of comparisons made by the failure processing circuitry indicating that the value at the input of the comparator deviates from the expected value; and
         C) iteratively altering the programming of the timing generator to produce strobe signals with a different time relationship to the input signal, re-running the pattern and recording the count of comparisons indicating that the value at the input of the comparator deviates from the expected value made by the failure processing circuitry; and
      iii) the act (c) comprises computing the duty cycle of the input signal from the total number of comparisons indicating that the value at the input of the comparator deviates from the expected value made by the failure processing circuitry.

20. The method of claim 19 wherein altering the programming of the timing generator comprises incrementing by a fraction of a period of the signal the programmed time of the strobe signal.

21. The method of claim 19 wherein the strobe signals have a time relationship to the signal that causes the comparator to make multiple comparisons to the signal in each period of the signal.

22. The method of claim 1 performed using automatic test equipment programmed to measure the duty cycle of an input signal, the automatic test equipment comprising:
   i) a timing generator that generates strobe signals at programmable times;
   ii) a comparator having an signal input coupled to the input signal, a strobe input coupled to the timing generator, a threshold input and an digital output having a state dependent on the relative level at the signal input and the threshold input at a time dictated by the strobe input;
   iii) failure processing circuitry coupled to the output of the comparator that may be controlled to count the number of digital outputs of the comparator indicating that the value at the input of the comparator deviates from a programmable expected value; and
   iv) a software program to control the automatic test system to perform a the method of claim 1, wherein:
      i) the act (b) comprises:
         A) running a pattern with the timing generator programmed to produce strobe signals with a first time relationship to the input signal, the pattern programming the expect value of the comparator to be a value indicating that the signal is in a first logical state;
         B) iteratively altering the programming of the timing generator to produce strobe signals with a different time relationship to the input signal and re-running the pattern;
      ii) the act (c) comprises computing the duty cycle of the signal from one or more values counted by the failure processing circuitry indicating the total number of comparisons during all iterations of the pattern indicating that the value at the input of the comparator deviates from the programmed expected value.

23. The automatic test equipment of claim 22 wherein the comparator is a differential comparator.

24. The automatic test equipment of claim 22 additionally comprising a general purpose digital computer and the software runs on the general purpose digital computer.

* * * * *